United States Patent
Honda et al.

(10) Patent No.: US 9,129,898 B2
(45) Date of Patent: *Sep. 8, 2015

(54) SEMICONDUCTOR ENCAPSULATION ADHESIVE COMPOSITION, SEMICONDUCTOR ENCAPSULATION FILM-LIKE ADHESIVE, METHOD FOR PRODUCING SEMICONDUCTOR DEVICE AND SEMICONDUCTOR DEVICE

(71) Applicant: Hitachi Chemical Company, Ltd., Tokyo (JP)

(72) Inventors: Kazutaka Honda, Ibaraki (JP); Tetsuya Enomoto, Ibaraki (JP); Yuuki Nakamura, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 27 days.

This patent is subject to a terminal disclaimer.

(21) Appl. No.: 13/933,230

(22) Filed: Jul. 2, 2013

(65) Prior Publication Data
US 2014/0015149 A1    Jan. 16, 2014

Related U.S. Application Data

(62) Division of application No. 12/788,110, filed on May 26, 2010, now Pat. No. 9,024,455.

(51) Int. Cl.
*H01L 23/29* (2006.01)
*H01L 21/56* (2006.01)
*C09J 163/00* (2006.01)

(52) U.S. Cl.
CPC ............ *H01L 23/293* (2013.01); *C09J 163/00* (2013.01); *H01L 21/563* (2013.01); *H01L 2224/73204* (2013.01); *H01L 2224/83192* (2013.01)

(58) Field of Classification Search
USPC .......................................................... 257/788
See application file for complete search history.

(56) References Cited

U.S. PATENT DOCUMENTS

| 5,427,996 | A | 6/1995 | Motoda et al. |
|---|---|---|---|
| 6,188,127 | B1 | 2/2001 | Senba et al. |
| 6,906,425 | B2 | 6/2005 | Stewart et al. |
| 7,459,339 | B2 | 12/2008 | Masumoto |
| 7,759,786 | B2 | 7/2010 | Kurita et al. |
| 2002/0119599 | A1 | 8/2002 | Egawa et al. |
| 2003/0114606 | A1 | 6/2003 | Taniguchi et al. |
| 2005/0209400 | A1* | 9/2005 | Tsumura et al. ............. 525/100 |
| 2006/0145363 | A1* | 7/2006 | Ikenaga et al. ............. 257/787 |
| 2007/0080444 | A1 | 4/2007 | Kurita et al. |

(Continued)

FOREIGN PATENT DOCUMENTS

| CN | 101538399 A | 9/2009 |
|---|---|---|
| JP | 10-130374 A | 5/1998 |

(Continued)

OTHER PUBLICATIONS

Office Action issued in co-pending related U.S. Appl. No. 12/788,100 on Oct. 10, 2013.

(Continued)

*Primary Examiner* — Stephen W Smoot
(74) *Attorney, Agent, or Firm* — Griffin & Szipl, P.C.

(57) ABSTRACT

A semiconductor encapsulation adhesive composition comprising (a) an epoxy resin, (b) a curing agent and (c) an antioxidant.

11 Claims, 5 Drawing Sheets

(56) References Cited

U.S. PATENT DOCUMENTS

| | | | |
|---|---|---|---|
| 2007/0134844 A1* | 6/2007 | Katoh et al. | 438/108 |
| 2008/0185361 A1 | 8/2008 | Summers | |
| 2008/0224325 A1 | 9/2008 | Nishimura et al. | |
| 2009/0127692 A1 | 5/2009 | Kawate et al. | |
| 2010/0029074 A1 | 2/2010 | MacKay et al. | |
| 2010/0193831 A1 | 8/2010 | Sato et al. | |
| 2010/0200882 A1* | 8/2010 | Kotani et al. | 257/98 |
| 2010/0207282 A1 | 8/2010 | Uchida et al. | |
| 2010/0244216 A1 | 9/2010 | Huang et al. | |
| 2011/0021707 A1 | 1/2011 | Kobayashi et al. | |
| 2011/0073901 A1 | 3/2011 | Fujita et al. | |
| 2011/0105637 A1 | 5/2011 | Fujita et al. | |

FOREIGN PATENT DOCUMENTS

| | | |
|---|---|---|
| JP | 2000-195182 A | 7/2000 |
| JP | 2002-012743 A | 1/2002 |
| JP | 2003-231876 A | 8/2003 |
| JP | 2003-246828 A | 9/2003 |
| JP | 2004-328000 A | 11/2004 |
| JP | 2005-307037 A | 11/2005 |
| JP | 2005-307169 A | 11/2005 |
| JP | 2006-160953 A | 6/2006 |
| JP | 2006-188573 A | 7/2006 |
| JP | 2007-189210 A | 7/2007 |
| JP | 2007-268723 A | 10/2007 |
| JP | 2001-342325 A | 12/2011 |
| WO | 2004/009348 A1 | 1/2004 |
| WO | 2007/032406 A2 | 3/2007 |
| WO | 2009/037834 A1 | 3/2009 |
| WO | 2009/041389 A1 | 4/2009 |

OTHER PUBLICATIONS

Office Action issued in co-pending Japanese application 2012-238252 on Sep. 3, 2013 (no translation available; submitted for certification).

Office Action issued in co-pending related Japanese application P2008-271305 on Aug. 28, 2012 (no translation available).

Kitamura et al., "Electronic Material Techniques," vol. 54, No. 3, pp. 53-58.

Office Action issued in counterpart Japanese application P2008-271305 on Mar. 12, 2013 (no translation available).

* cited by examiner

SEMICONDUCTOR ENCAPSULATION ADHESIVE COMPOSITION, SEMICONDUCTOR ENCAPSULATION FILM-LIKE ADHESIVE, METHOD FOR PRODUCING SEMICONDUCTOR DEVICE AND SEMICONDUCTOR DEVICE

This application is a Divisional of U.S. Ser. No. 12/788,110, filed May 26, 2010, the entire disclosure of which is incorporated herein by reference.

BACKGROUND OF THE INVENTION

1. Field of the Invention

The present invention relates to a semiconductor encapsulation adhesive composition, to a semiconductor encapsulation film-like adhesive, to a method for producing a semiconductor device and to a semiconductor device.

2. Related Background Art

Wire bonding systems employing metal small-gauge wires such as gold wires have been widely used in the past for connection of semiconductor chips and boards; however, as demands increase for reduced size, smaller thicknesses and higher functionality for semiconductor devices, it is becoming increasingly popular to employ flip-chip connection systems, wherein conductive protrusions known as "bumps" are formed on semiconductor chips and the electrodes of the board and semiconductor chips are directly connected through the bumps.

The methods used in flip-chip connection systems include metal bonding using solder or tin, metal bonding accomplished by application of ultrasonic vibration and formation of permanent mechanical contact by the contractive force of a resin, but metal bonding with solder or tin is most commonly employed because it results in more reliable joints.

Liquid crystal display modules, which continue to decrease in size and increase in functionality in recent years, employ semiconductor devices known as COF (Chip On Film) devices, wherein liquid crystal-driving semiconductor chips provided with gold bumps are mounted on a polyimide board bearing tin coated wirings by metal bonding via gold-tin eutectic connection.

Because gold-tin eutectic connection are formed in a COF, the joints must be at the eutectic temperature of 278° C. or above. Heating is carried out at above the eutectic temperature for a short connection time of no longer than 5 seconds, to improve productivity, and therefore the preset temperature of the apparatus must be a high temperature of 200-400° C.

In COF, it is necessary to underfill the gaps between the semiconductor chips and board with a resin in order to protect the joint from the external environment and avoid concentration of external stress on the joint, while also ensuring sufficient electronic insulation reliability for narrow-pitch interconnects. Current underfill methods generally involve injection of the liquid resin by capillary flow, and curing, after connection between the semiconductor chips and board, but the longer time required for injection between the reduced chip-board gaps formed in narrow-pitch connection tends to lower productivity. This problem can be surmounted by a method of connecting the chips and board after supplying an adhesive to the chips or board (see Japanese Unexamined Patent Publication No. 2006-188573 and Matsushita Denko Technical Report, vol. 54 No. 3, P53-58).

SUMMARY OF THE INVENTION

When semiconductor chips and a board are connected at a high temperature of above 200° C. after adhesive has been laminated to the bumped wafer or board (substrate) in COF, air bubbles known as "voids" often generate by the volatilizing components it contains. The generated voids reduce the adhesive force and cause peeling between the underfill (the resin filling the gaps between the semiconductor chips and board) and the semiconductor chips and board, thus potentially resulting in poor connection and lower electronic insulation reliability. In addition, moisture that becomes trapped in the voids promotes diffusion and migration of impurity ions and eluted metals in the system, thus also potentially lowering the electronic insulation reliability.

Other causes of lower electronic insulation reliability include corrosion deposits around bonding parts of the semiconductor device due to impurity ions and eluted metals in the underfill, semiconductor chips and polyimide board, and formation of conductive substances (such as tin oxide) resulting from oxidation of tin coating on the board wiring, the nickel and chromium that are commonly used in the adhesive layer between the wiring and board, the copper used for the wirings, and the gold used for the bumps.

It is an object of the present invention to provide a semiconductor encapsulation adhesive composition that exhibits high electronic insulation reliability, a semiconductor encapsulation film-like adhesive, a method for producing a semiconductor device and a semiconductor device, which overcome the aforementioned problems of the prior art by an effect of inhibiting formation of voids during connection between semiconductor chips and boards at high temperatures of 200° C. and above, and inhibiting production of conductive substances due to oxidation of tin coatings on board wirings.

In order to achieve the object stated above, the invention provides a semiconductor encapsulation adhesive composition comprising (a) an epoxy resin, (b) a curing agent and (c) an antioxidant.

The semiconductor encapsulation adhesive composition having such a construction can inhibit formation of voids during connection between semiconductor chips and boards at high temperatures of 200° C. and above, while also inhibiting production of conductive substances that become deposited on boards, bumps and wirings, and thus exhibits high electronic insulation reliability.

The semiconductor encapsulation adhesive composition of the invention preferably further comprises (d) a high molecular component with a weight-average molecular weight of 10,000 or greater. This will result in satisfactory film formability, for formation of the semiconductor encapsulation adhesive composition into a film.

The (d) high molecular component is preferably a polyimide resin. This will result in even more satisfactory film formability, for formation of the semiconductor encapsulation adhesive composition into a film, while also improving the heat resistance.

The polyimide resin preferably has a weight-average molecular weight of 30,000 or greater and a glass transition temperature of no higher than 100° C. A polyimide resin with a weight-average molecular weight of 30,000 or greater will allow more satisfactory film formability to be exhibited. Also, a polyimide resin with a glass transition temperature of no higher than 100° C. will permit satisfactory attachability (lamination ability) to the board and semiconductor chips.

The (b) curing agent in the semiconductor encapsulation adhesive composition of the invention is preferably a phenol compound. Phenol compounds used as curing agents for epoxy resins have excellent curing and molding performance.

The (c) antioxidant in the semiconductor encapsulation adhesive composition of the invention is preferably a hindered phenol. A hindered phenol with bulky functional groups surrounding the phenolic hydroxyl group will have a lower tendency to participate in curing reaction with the epoxy compound, while also trapping radicals and being itself oxidized, thus preventing oxidation of other metals. This will dramatically improve the HAST resistance.

The invention further provides a semiconductor encapsulation film-like adhesive obtained by shaping the semiconductor encapsulation adhesive composition of the invention into a film.

The semiconductor encapsulation film-like adhesive, having a construction that employs a semiconductor encapsulation adhesive composition of the invention as described above, can inhibit formation of voids during connection between semiconductor chips and boards at high temperatures of 200° C. and above, while also inhibiting production of conductive substances that become deposited on boards, bumps and wirings, and thus exhibits high electronic insulation reliability.

The semiconductor encapsulation film-like adhesive of the invention preferably has a melt viscosity of no greater than 2000 Pa·s at 350° C. This will result in more satisfactory conductivity, connectivity and electronic insulation reliability when the semiconductor chips and board are connected at high temperatures of 200° C. and above.

The semiconductor encapsulation film-like adhesive of the invention also preferably has a void formation rate of no greater than 5% upon contact bonding for 5 seconds at 350° C., 1 MPa.

The invention further provides a method for producing a semiconductor device that comprises a step of connecting bump-bearing semiconductor chips to a board with metal wiring at a temperature of 200° C. or above using a semiconductor encapsulation adhesive composition according to the invention, and underfilling the gaps between the semiconductor chips and the board using the semiconductor encapsulation adhesive composition.

The invention further provides a method for producing a semiconductor device that comprises a step of connecting bump-bearing semiconductor chips to a board with metal wiring at a temperature of 200° C. or above using a semiconductor encapsulation film-like adhesive according to the invention, and underfilling the gaps between the semiconductor chips and the board using the semiconductor encapsulation film-like adhesive.

Since the semiconductor encapsulation adhesive composition or semiconductor encapsulation film-like adhesive described above is used to connect the semiconductor chips and board in this method for producing a semiconductor device, formation of voids between the semiconductor chips and board is satisfactorily inhibited and a semiconductor device with sufficient interconnect electronic insulation reliability can be efficiently produced. Furthermore, since the semiconductor encapsulation adhesive composition and semiconductor encapsulation film-like adhesive contain the (c) antioxidant, it is possible to efficiently produce a semiconductor device with enhanced HAST resistance.

In the method for producing a semiconductor device of the invention, preferably the bumps used are gold bumps, the metal wiring has tin coating on the surface, the board is a polyimide board, and the semiconductor chips and board are connected by forming gold-tin eutectic connection at a temperature of 200° C. or above. This production method allows production of a COF having gold bump-formed semiconductor chips mounted on a polyimide board by metal bonding with gold-tin eutectic connection.

The invention still further provides a semiconductor device produced by the method for producing a semiconductor device according to the invention.

Since such a semiconductor device is produced by the method for producing a semiconductor device according to the invention, formation of voids between the semiconductor chips and board is inhibited and satisfactory interconnect electronic insulation reliability is obtained.

According to the invention it is possible to obtain high electronic insulation reliability with a semiconductor encapsulation adhesive composition, a semiconductor encapsulation film-like adhesive, a method for producing a semiconductor device and a semiconductor device, because formation of voids can be inhibited during connection between semiconductor chips and boards at high temperatures of 200° C. and above, and production of conductive substances that deposit onto boards, bumps and wirings can be inhibited by an antioxidant effect.

DESCRIPTION OF THE PREFERRED EMBODIMENTS

Figure 1:
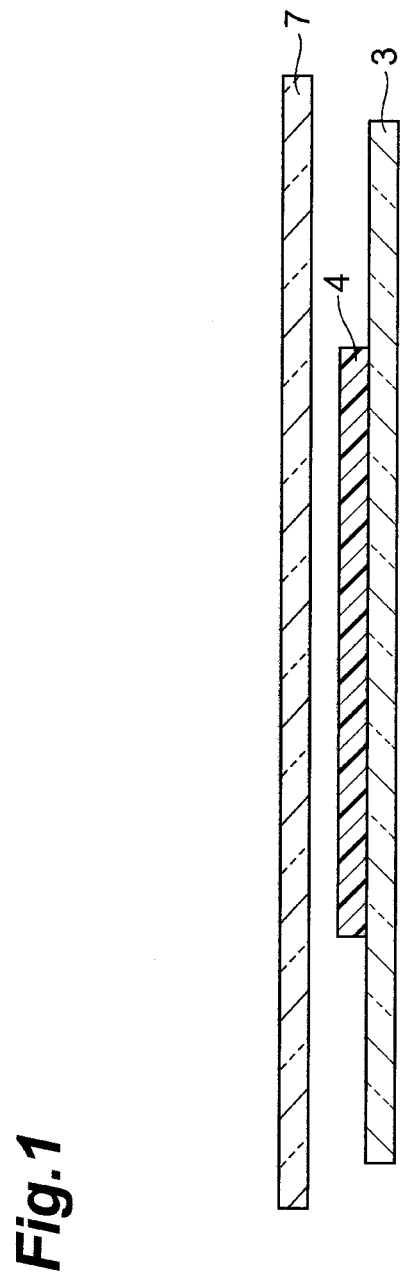
FIG. 1 is a schematic cross-sectional view showing the condition of melt viscosity measuring sample A before contact bonding.

Preferred embodiments of the invention will now be described in detail.

(Semiconductor Encapsulation Adhesive Composition, Semiconductor Encapsulation Film-Like Adhesive and Method for Producing them)

The semiconductor encapsulation adhesive composition of the invention comprises (a) an epoxy resin, (b) a curing agent and (c) an antioxidant, and preferably also (d) a high molecular component with a weight-average molecular weight of 10,000 or greater. The semiconductor encapsulation film-like adhesive of the invention is the aforementioned semiconductor encapsulation adhesive composition of the invention formed into a film, and it comprises (a) an epoxy resin, (b) a curing agent and (c) an antioxidant, and preferably also (d) a high molecular component with a weight-average molecular weight of 10,000 or greater. Each of these components will now be explained.

(a) Epoxy Resin

The (a) epoxy resin used for the invention preferably has two or more epoxy groups in the molecule, and it may be any of various polyfunctional epoxy resins such as bisphenol A-type epoxy resin, bisphenol F-type epoxy resin, naphthalene-type epoxy resin, phenol-novolac-type epoxy resin, cresol-novolac-type epoxy resin, phenolaralkyl-type epoxy resin, biphenyl-type epoxy resin, triphenylmethane-type epoxy resin or dicyclopentadiene-type epoxy resin. Any of the above may be used alone, or two or more thereof may be used in admixture. For example, a bisphenol A-type or bisphenol F-type liquid epoxy resin is preferably used as a room temperature-solid epoxy resin since these have 1% thermogravimetric loss of below 250° C. and can potentially decompose, generating volatilizing components, during high-temperature heating.

(b) Curing Agent

The (b) curing agent used for the invention may be, for example, a phenolic compound, acid anhydride-based curing agent, amine-based curing agent, imidazole or phosphine.

Any phenol compound may be used that has two or more phenolic hydroxyl groups in the molecule, and examples include phenol-novolac, cresol-novolac and phenolaralkyl resins, cresolnaphthol-formaldehyde polycondensates, triphenylmethane-type polyfunctional phenols and polyfunctional phenol resins. Any of the above may be used alone, or two or more thereof may be used in admixture. Liquid phenols can undergo decomposition and generate volatilizing components during high-temperature heating, and it is therefore preferred to use a phenol compound that is solid at room temperature. The equivalent ratio of the (a) epoxy resin and phenol compound (phenol compound/(a) epoxy resin) is preferably 0.3-1.5 from the viewpoint of curability, adhesion and storage stability. It is more preferably 0.4-1.0 and even more preferably 0.5-1.0. An equivalent ratio of smaller than 0.3 may lower the curability and reduce the adhesive force, while an equivalent ratio of greater than 1.5 will leave an excess of unreacted phenolic hydroxyl groups, thus potentially increasing moisture absorptivity and lowering the electronic insulation reliability.

Examples of acid anhydride-based curing agents to be used include methylcyclohexanetetracarboxylic dianhydride, trimellitic anhydride, pyromellitic anhydride, benzophenonetetracarboxylic dianhydride and ethylene glycolbisanhydrotrimellitate. Any of the above may be used alone, or two or more thereof may be used in admixture. Liquid acid anhydrides can decompose under high-temperature heating, producing volatilizing components, and therefore acid anhydrides that are solid at room temperature are preferred. The equivalent ratio of the (a) epoxy resin and acid anhydride (acid anhydride/(a) epoxy resin) is preferably 0.3-1.5 from the viewpoint of curability, adhesion and storage stability. It is more preferably 0.4-1.0 and even more preferably 0.5-1.0. An equivalent ratio of smaller than 0.3 may lower the curability and reduce the adhesive force, while an equivalent ratio of greater than 1.5 will leave an excess of unreacted acid anhydride groups, thus potentially increasing the absorption percentage and lowering the electronic insulation reliability.

Dicyandiamide is an example of an amine-based curing agent that may be used. Liquid amines can undergo decomposition and generate volatilizing components during high-temperature heating, and it is therefore preferred to use an amine that is solid at room temperature. The equivalent ratio of the (a) epoxy resin and amine (amine/(a) epoxy resin) is preferably 0.3-1.5 from the viewpoint of curability, adhesion and storage stability. It is more preferably 0.4-1.0 and even more preferably 0.5-1.0. An equivalent ratio of smaller than 0.3 may lower the curability and reduce the adhesive force, while an equivalent ratio of greater than 1.5 will leave an excess of unreacted amine groups, thus potentially lowering the electronic insulation reliability.

As examples of imidazoles there may be mentioned 2-phenylimidazole, 2-phenyl-4-methylimidazole, 1-benzyl-2-methylimidazole, 1-benzyl-2-phenylimidazole, 1-cyanoethyl-2-undecylimidazole, 1-cyano-2-phenylimidazole, 1-cyanoethyl-2-undecylimidazole trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazineisocyanuric acid adduct, 2-phenylimidazoleisocyanuric acid adduct, 2-phenyl-4,5-dihydroxymethylimidazole, 2-phenyl-4-methyl-5-hydroxymethylimidazole, and epoxy resin and imidazole adducts. Preferred for use according to the invention, from the viewpoint of curability, storage stability and connection reliability, are 1-cyanoethyl-2-undecylimidazole, 1-cyanoethyl-2-undecylimidazole trimellitate, 1-cyanoethyl-2-phenylimidazole, 1-cyanoethyl-2-phenylimidazolium trimellitate, 2,4-diamino-6-[2'-methylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazineisocyanuric acid adduct, 2-phenylimidazoleisocyanuric acid adduct, 2-phenyl-4,5-dihydroxymethylimidazole and 2-phenyl-4-methyl-5-hydroxymethylimidazole. These may be used alone or in combinations of two or more. They may also be used in microcapsulated form for increased latency. They are preferably added in a weight ratio of 0.001-0.1 and more preferably 0.001-0.05 with respect to the (a) epoxy resin. The curability may be reduced at a weight ratio of less than 0.001, while at a weight ratio of greater than 0.1, curing may take place before the metal-metal joints are established, potentially resulting in connection defects. An imidazole may be used alone with the (a) epoxy resin, but it may also be used as a curing accelerator together with a phenol compound, acid anhydride-based curing agent or amine-based curing agent.

As examples of phosphines there may be mentioned triphenylphosphine, tetraphenylphosphonium tetraphenylborate, tetraphenylphosphonium tetra(4-methylphenyl)borate and tetraphenylphosphonium (4-fluorophenyl)borate. They are preferably added in a weight ratio of 0.001-0.1 and more preferably 0.001-0.05 with respect to the (a) epoxy resin. The curability may be reduced at a weight ratio of less than 0.001, while at a weight ratio of greater than 0.1, curing may take place before the metal-metal joints are established, potentially resulting in connection defects. A phosphine may be used alone with the (a) epoxy resin, but it may also be used as the curing accelerator together with a phenol compound, acid anhydride-based curing agent or amine-based curing agent.

(c) Antioxidant

The (c) antioxidant used for the invention may be selected as suitable for the composition of the semiconductor encapsulation adhesive composition. The (c) antioxidant is preferably one or more antioxidants selected from the group consisting of phenol-based antioxidants, phosphite-based antioxidants and sulfur-based antioxidants.

A preferred phenol-based antioxidant is a compound having a substituent with high steric hindrance such as a tert-butyl group or trimethylsilyl group at the ortho position of the phenolic hydroxyl. Phenol-based antioxidants are also known as "hindered phenol-based antioxidants".

The phenol-based antioxidant is preferably one or a combination of compounds selected from the group consisting of 2-tert-butyl-4-methoxyphenol, 3-tert-butyl-4-methoxyphenol, 2,6-di-tert-butyl-4-ethylphenol, 2,2'-methylene-bis(4-methyl-6-tert-butylphenol), 4,4'-thiobis-(3-methyl-6-tert-butylphenol), 4,4'-butylidenebis(3-methyl-6-tert-butylphenol), 1,1,3-tris(2-methyl-4-hydroxy-5-tert-butylphenyl)butane, 1,3,5-trimethyl-2,4,6-tris(3,5-di-tert-butyl-4-hydroxybenzyl)benzene and tetrakis-[methylene-3-(3',5'-di-tert-butyl-4'-hydroxyphenyl)propionate]methane, and more preferably it is 4,4'-butylidenebis(3-methyl-6-tert-butylphenol) and/or 1,1,3-tris(2-methyl-4-hydroxy-5-tert-butylphenyl)butane. When it is desired to increase electronic insulation reliability, the phenol-based antioxidant is preferably 1,1,3-tris(2-methyl-4-hydroxy-5-tert-butylphenyl)butane. A mixture of 2-tert-butyl-4-methoxyphenol and 3-tert-butyl-4-methoxyphenol is commonly used as an antioxidant, and is known as butylated hydroxyanisole.

A phosphite-based antioxidant is preferably one or a mixture of compounds selected from the group consisting of triphenyl phosphite, diphenylisodecyl phosphite, phenyldiisodecyl phosphite, 4,4'-butylidene-bis(3-methyl-6-tert-butylphenylditridecyl)phosphite, cyclic neopentanetetrayl bis(nonylphenyl)phosphite, cyclic neopentanetetrayl bis(dinonylphenyl)phosphite, cyclic neopentanetetrayl tris(nonylphenyl)phosphite, cyclic neopentanetetrayl tris(dinonylphenyl)phosphite, 10-(2,5-dihydroxyphenyl)-10H-9-oxa-10-phosphaphenanthrene-10-oxide, diisodecylpentaerythritol diphosphite and tris(2,4-di-tert-butylphenyl)phosphite, and it is more preferably 10-(2,5-dihydroxyphenyl)-10H-9-oxa-10-phosphaphenanthrene-10-oxide.

A sulfur-based antioxidant is preferably one or a mixture of compounds selected from the group consisting of dilauryl 3,3'-thiodipropionate, distearyl 3,3'-thiodipropionate, N-cyclohexylthiophthalimide and N-n-butylbenzenesulfonamide. Dilauryl 3,3'-thiodipropionate is also known as dilauryl thiodipropionate, and distearyl 3,3'-thiodipropionate is also known as distearyl thiodipropionate.

The (c) antioxidant may be synthesized and/or prepared by common procedures, or it may be obtained as a commercial product. Examples of commercially available antioxidants include the phenol-based antioxidants YOSHINOX BB, YOSHINOX BHT and YOSHINOX 425 (trade names of API Corporation), TTIC and TTAD (trade names of Toray Co., Ltd.), IRGANOX L107 (trade name of Ciba Specialty Chemicals), and AO-20, AO-30, AO-40, AO-50, AO-50F, AO-60, AO-60G, AO-70, AO-80 and AO-330 (trade names of Adeka Corp.). Especially preferred among these is AO-60, which has tert-butyl groups on both sides of the phenolic hydroxyl ortho position, and includes 4 such backbones. Compounds wherein the phenolic hydroxyl groups are surrounded by bulkier substituents and thus have higher steric hindrance, and which contain a greater number of such backbones, may be expected to exhibit a greater effect of improved electronic insulation reliability. Available phosphite-based antioxidants include PEP-4C, PEP-8, PEP-8W, PEP-24G, PEP-36, PEP-36Z, HP-10, HP-2112 and HP-2112RG (all trade names of Adeka Corp.). Available sulfur-based antioxidants include AO-412S and AO-503 (both trade names of Adeka Corp.).

These antioxidants may be used alone or in combinations of two or more.

(d) High Molecular Component with Weight-Average Molecular Weight of 10,000 or Greater The (d) high molecular component with a weight-average molecular weight of 10,000 or greater used for the invention may be a phenoxy resin, polyimide resin, polyamide resin, polycarbodiimide resin, phenol resin, cyanate ester resin, acrylic resin, polyester resin, polyethylene resin, polyethersulfone resin, polyetherimide resin, polyvinylacetal resin, urethane resin, acrylic rubber or the like, among which phenoxy resins, polyimide resins, cyanate ester resins, polycarbodiimide resins and acrylic rubber are preferred, and phenoxy resins, polyimide resins and acrylic rubber are especially preferred, for their excellent heat resistance and film formability. These high molecular components may be used alone or as mixtures or copolymers of two or more different types.

When a polyimide resin is used as the (d) high molecular component, it may be obtained by, for example, condensation of a tetracarboxylic dianhydride and diamine by a known process. Specifically, the tetracarboxylic dianhydride and diamine are subjected to addition reaction in an organic solvent at an equimolar ratio or approximately equimolar ratio (with the components being added in any desired order), at a reaction temperature of no higher than 80° C. and preferably 0-60° C. The viscosity of the reaction mixture will gradually increase as the reaction proceeds, forming polyamide acid as the polyimide precursor. In order to prevent reduction in the properties of the film-like adhesive, the acid dianhydride is preferably one that has been subjected to recrystallizing purifying treatment with acetic anhydride.

The polyamide acid is heated at a temperature of 50-80° C. for depolymerization to adjust the molecular weight.

The polyimide resin may be obtained by dehydrating cyclization of the reaction product (polyamide acid). Dehydrating cyclization can be accomplished by thermal cyclization using heat treatment and by chemical cyclization using a dehydrating agent.

There are no particular restrictions on tetracarboxylic dianhydrides to be used as starting materials for the polyimide resin, and as examples there may be mentioned pyromellitic acid dianhydride, 3,3',4,4'-biphenyltetracarboxylic dianhydride, 2,2',3,3'-biphenyltetracarboxylic dianhydride, 2,2-bis(3,4-dicarboxyphenyl)propane dianhydride, 2,2-bis(2,3-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)methane dianhydride, bis(3,4-dicarboxyphenyl)sulfone dianhydride, 3,4,9,10-perylenetetracarboxylic dianhydride, bis(3,4-dicarboxyphenyl)ether dianhydride, benzene-1,2,3,4-tetracarboxylic dianhydride, 3,4,3',4'-benzophenonetetracarboxylic dianhydride, 2,3,2',3'-benzophenonetetracarboxylic dianhydride, 3,3,3',4'-benzophenonetetracarboxylic dianhydride, 1,2,5,6-naphthalenetetracarboxylic dianhydride, 1,4,5,8-naphthalenetetracarboxylic dianhydride, 2,3,6,7-naphthalenetetracarboxylic dianhydride, 1,2,4,5-naphthalenetetracarboxylic dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyrazine-2,3,5,6-tetracarboxylic dianhydride, thiophene-2,3,5,6-tetracarboxylic dianhydride, 2,3,3',4'-biphenyltetracarboxylic dianhydride, 3,4,3',4'-biphenyltetracarboxylic dianhydride, 2,3,2',3'-biphenyltetracarboxylic dianhydride, bis(3,4-dicarboxyphenyl)dimethylsilane dianhydride, bis(3,4-dicarboxyphenyl)methylphenylsilane dianhydride, bis(3,4-dicarboxyphenyl)diphenylsilane dianhydride, 1,4-bis(3,4-dicarboxyphenyldimethylsilyl)benzene dianhydride, 1,3-bis(3,4-dicarboxyphenyl)-1,1,3,3-tetramethyldicyclohexane dianhydride, p-phenylenebis(trimellitate anhydride), ethylenetetracarboxylic dianhydride, 1,2,3,4-butanetetracarboxylic dianhydride, decahydronaphthalene-1,4,5,8-tetracarboxylic dianhydride, 4,8-dimethyl-1,2,3,5,6,7-hexahydronaphthalene-1,2,5,6-tetracarboxylic dianhydride, cyclopentane-1,2,3,4-tetracarboxylic dianhydride, pyrrolidine-2,3,4,5-tetracarboxylic dianhydride, 1,2,3,4-cyclobutanetetracarboxylic dianhydride, bis(exo-bicyclo[2,2,1]heptane-2,3-dicarboxylic dianhydride, bicyclo-[2,2,2]-oct-7-ene-2,3,5,6-tetracarboxylic dianhydride, 2,2-bis(3,4-dicarboxyphenyl)propane dianhydride, 2,2,-bis[4-(3,4-dicarboxyphenyl)phenyl]propane dianhydride, 2,2-bis(3,4-dicarboxyphenyl)hexafluoropropane dianhydride, 2,2,-bis

[4-(3,4-dicarboxyphenyl)phenyl]hexafluoropropane dianhydride, 4,4'-bis(3,4-dicarboxyphenoxy)diphenyl sulfide dianhydride, 1,4-bis(2-hydroxyhexafluoroisopropyl)benzenebis(trimellitic anhydride), 1,3-bis(2-hydroxyhexafluoroisopropyl)benzenebis(trimellitic anhydride), 5-(2,5-dioxotetrahydrofuryl)-3-methyl-3-cyclohexene-1,2-dicarboxylic dianhydride, tetrahydrofuran-2,3,4,5-tetracarboxylic dianhydride, tetracarboxylic dianhydrides represented by formula (I) and tetracarboxylic dianhydrides represented by formula (II).

[Chemical Formula 1]

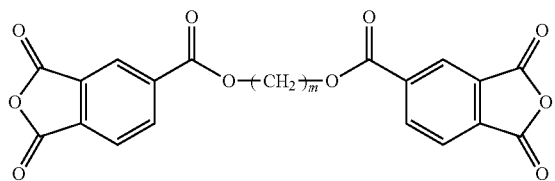

(I)

[In the formula, m represents an integer of 2-20.]

[Chemical Formula 2]

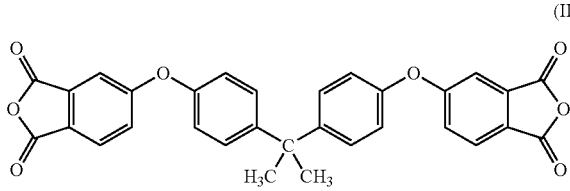

(II)

A tetracarboxylic dianhydride represented by formula (I) can be synthesized from trimellitic anhydride monochloride and its corresponding diol, for example, and specifically there may be mentioned 1,2-(ethylene)bis(trimellitate anhydride), 1,3-(trimethylene)bis(trimellitate anhydride), 1,4-(tetramethylene)bis(trimellitate anhydride), 1,5-(pentamethylene)bis(trimellitate anhydride), 1,6-(hexamethylene)bis(trimellitate anhydride), 1,7-(heptamethylene)bis(trimellitate anhydride), 1,8-(octamethylene)bis(trimellitate anhydride), 1,9-(nonamethylene)bis(trimellitate anhydride), 1,10-(decamethylene)bis(trimellitate anhydride), 1,12-(dodecamethylene)bis(trimellitate anhydride), 1,16-(hexadecamethylene)bis(trimellitate anhydride) and 1,18-(octadecamethylene)bis(trimellitate anhydride).

Of the tetracarboxylic dianhydrides mentioned above, tetracarboxylic dianhydrides represented by formula (II) are preferred from the viewpoint of imparting excellent moisture-proof reliability. These tetracarboxylic dianhydrides may be used alone or in combinations of two or more.

The content of tetracarboxylic dianhydrides represented by formula (II) is preferably at least 40 mol %, more preferably at least 50 mol % and even more preferably at least 70 mol % with respect to the total tetracarboxylic dianhydrides. At less than 40 mol %, the effect of moisture-proof reliability provided by using the tetracarboxylic dianhydride of formula (II) may not be satisfactorily exhibited.

There are no particular restrictions on the diamine used as a starting material for the polyimide resin, and as examples there may be mentioned aromatic diamines such as o-phenylenediamine, m-phenylenediamine, p-phenylenediamine, 3,3'-diaminodiphenyl ether, 3,4'-diaminodiphenyl ether, 4,4'-diaminodiphenyl ether, 3,3'-diaminodiphenylmethane, 3,4'-diaminodiphenylmethane, 4,4'-diaminodiphenylmethane, bis(4-amino-3,5-dimethylphenyl)methane, bis(4-amino-3,5-diisopropylphenyl)methane, 3,3'-diaminodiphenyldifluoromethane, 3,4'-diaminodiphenyldifluoromethane, 4,4'-diaminodiphenyldifluoromethane, 3,3'-diaminodiphenylsulfone, 3,4'-diaminodiphenylsulfone, 4,4'-diaminodiphenylsulfone, 3,3'-diaminodiphenyl sulfide, 3,4'-diaminodiphenyl sulfide, 4,4'-diaminodiphenyl sulfide, 3,3'-diaminodiphenylketone, 3,4'-diaminodiphenylketone, 4,4'-diaminodiphenylketone, 2,2-bis(3-aminophenyl)propane, 2,2'-(3,4'-diaminodiphenyl)propane, 2,2-bis(4-aminophenyl)propane, 2,2-bis(3-aminophenyl)hexafluoropropane, 2,2-(3,4'-diaminodiphenyl)hexafluoropropane, 2,2-bis(4-aminophenyl)hexafluoropropane, 1,3-bis(3-aminophenoxy)benzene, 1,4-bis(3-aminophenoxy)benzene, 1,4-bis(4-aminophenoxy)benzene, 3,3'-(1,4-phenylenebis(1-methylethylidene))bisaniline, 3,4'-(1,4-phenylenebis(1-methylethylidene))bisaniline, 4,4'-(1,4-phenylenebis(1-methylethylidene))bisaniline, 2,2-bis(4-(3-aminophenoxy)phenyl)propane, 2,2-bis(4-(3-aminophenoxy)phenyl)hexafluoropropane, 2,2-bis(4-(4-aminophenoxy)phenyl)hexafluoropropane, bis(4-(3-aminoenoxy)phenyl)sulfide, bis(4-(4-aminoenoxy)phenyl)sulfide, bis(4-(3-aminoenoxy)phenyl)sulfone, bis(4-(4-aminoenoxy)phenyl)sulfone and 3,5-diaminobenzoic acid, 1,3-bis(aminomethyl)cyclohexane, 2,2-bis(4-aminophenoxyphenyl)propane, aliphatic etherdiamines represented by formula (III), aliphatic diamines represented by formula (IV), and siloxanediamines represented by formula (V).

[Chemical Formula 3]

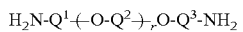

(III)

[In the formula, $Q^1$, $Q^2$ and $Q^3$ each independently represent a C1-10 alkylene group, and r represents an integer of 2-80.]

[Chemical Formula 4]

(IV)

[In the formula, q represents an integer of 5-20.]

[Chemical Formula 5]

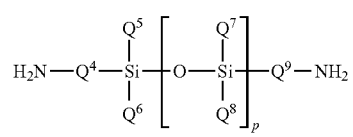

(V)

[In the formula, $Q^4$ and $Q^9$ each independently represent a C1-5 alkylene or optionally substituted phenylene group, $Q^5$, $Q^6$, $Q^7$ and $Q^8$ each independently represent a C1-5 alkyl, phenyl or phenoxy group, and p represents an integer of 1-5.]

Diamines represented by formulas (III) and (IV) are preferred among the aforementioned diamines from the viewpoint of low-stress, low-temperature lamination and low-temperature adhesion properties. From the viewpoint of low water absorption and low hygroscopicity, diamines represented by formula (V) are preferred. These diamines may be used alone or in combinations of two or more. When a combination is used, preferably the aliphatic etherdiamine represented by formula (III) is used at 1-50 mol % of the total diamines, the aliphatic diamine represented by formula (IV) is used at 20-79 mol % of the total diamines, and the siloxanediamine represented by formula (V) is used at 20-79 mol % of the total diamines. Contents outside of these ranges are undesirable because they will tend to reduce the effect of imparting low-temperature lamination and low water absorption properties.

As specific aliphatic etherdiamines represented by formula (III) there may be mentioned aliphatic etherdiamines represented by the following formulas:

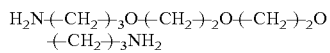

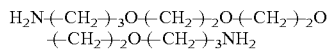

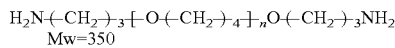
Mw=350

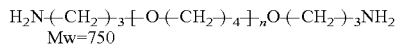
Mw=750

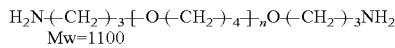
Mw=1100

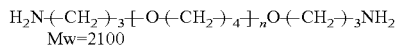
Mw=2100

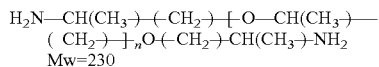
Mw=230

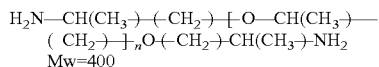
Mw=400

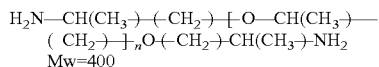
Mw=2000

[Chemical Formula 6]

and aliphatic etherdiamines represented by formula (VI). Aliphatic etherdiamines represented by formula (VI) are more preferred among these, since they can ensure low-temperature lamination properties and satisfactory adhesion to organic resist-bearing boards.

[Chemical Formula 7]

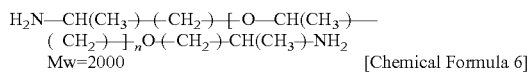

(VI)

[In the formula, s represents an integer of 2-80.]

As specific aliphatic etherdiamines represented by formula (VI) there may be mentioned aliphatic diamines, including polyoxyalkylenediamines such as JEFFAMINE D-230, D-400, D-2000, D-4000, ED-600, ED-900, ED-2001 and EDR-148 by San Techno Chemical Co., Ltd., and polyetheramine D-230, D-400 and D-2000 by BASF.

As examples of aliphatic diamines represented by formula (IV) there may be mentioned 1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane and 1,2-diaminocyclohexane, among which 1,9-diaminononane, 1,10-diaminodecane, 1,11-diaminoundecane and 1,12-diaminododecane are preferred.

As examples of siloxanediamines represented by formula (V) there may be mentioned, as compounds wherein p is 1: 1,1,3,3-tetramethyl-1,3-bis(4-aminophenyl)disiloxane, 1,1,3,3-tetraphenoxy-1,3-bis(4-aminoethyl)disiloxane, 1,1,3,3-tetraphenyl-1,3-bis(2-aminoethyl)disiloxane, 1,1,3,3-tetraphenyl-1,3-bis(3-aminopropyl)disiloxane, 1,1,3,3-tetramethyl-1,3-bis(2-aminoethyl)disiloxane, 1,1,3,3-tetramethyl-1,3-bis(3-aminopropyl)disiloxane, 1,1,3,3-tetramethyl-1,3-bis(3-aminobutyl)disiloxane and 1,3-dimethyl-1,3-dimethoxy-1,3-bis(4-aminobutyl)disiloxane, and as compounds wherein p is 2: 1,1,3,3,5,5-hexamethyl-1,5-bis(4-aminophenyl)trisiloxane, 1,1,5,5-tetraphenyl-3,3-dimethyl-1,5-bis(3-aminopropyl)trisiloxane, 1,1,5,5-tetraphenyl-3,3-dimethoxy-1,5-bis(4-aminobutyl)tri siloxane, 1,1,5,5-tetraphenyl-3,3-dimethoxy-1,5-bis(5-aminopentyl) trisiloxane, 1,1,5,5-tetramethyl-3,3-dimethoxy-1,5-bis(2-aminoethyl)trisiloxane, 1,1,5,5-tetramethyl-3,3-dimethoxy-1,5-bis(4-aminobutyl)trisiloxane, 1,1,5,5-tetramethyl-3,3-dimethoxy-1,5-bis(5-aminopentyl)trisiloxane, 1,1,3,3,5,5-hexamethyl-1,5-bis(3-aminopropyl)trisiloxane, 1,1,3,3,5,5-hexaethyl-1,5-bis(3-aminopropyl)trisiloxane and 1,1,3,3,5,5-hexapropyl-1,5-bis(3-aminopropyl)trisiloxane.

These polyimide resins may be used alone, or if necessary they may be used as mixtures (blends) of two or more different types.

The glass transition temperature (Tg) of the polyimide resin is preferably no higher than 100° C. and more preferably no higher than 75° C. from the viewpoint of attachability (lamination ability) to boards and chips. A Tg of higher than 100° C. will not allow filling in of the irregularities including the bumps formed on the semiconductor chips or the electrodes or wiring patterns formed on the board, thus leaving air bubbles and tending to create voids. The Tg is the value measured using a DSC (Model DSC-7, trade name of Perkin-Elmer), with a sample weight of 10 mg, a temperature-elevating rate of 5° C./min and a measuring atmosphere of air.

The weight-average molecular weight of the polyimide resin is preferably at least 30,000, more preferably at least 40,000 and even more preferably at least 50,000, based on polystyrene, so that it can exhibit satisfactory film formability alone. A weight-average molecular weight of lower than 30,000 may result in reduced film formability. The weight-average molecular weight is the value measured in terms of polystyrene using a C-R4A high-performance liquid chromatograph (trade name of Shimadzu Corp.).

High molecular component with weight-average molecular weight of 10,000 or greater (d), epoxy resin (a) and curing agent (b) The weight ratio of the mixture is not particularly restricted, but in order to maintain a film shape, the mixture of the (a) epoxy resin and (b) curing agent is preferably used at 0.01-4 parts by weight, more preferably 0.1-4 parts by weight and even more preferably 0.1-3 parts by weight with respect to 1 part by weight of the (d) high molecular component with a weight-average molecular weight of 10,000 or greater. If this weight ratio is less than 0.01 part by weight the curability and adhesive force of the film-like adhesive may be reduced, while if it is greater than 4 parts by weight the film formability may be reduced.

The adhesive composition and film-like adhesive of the invention preferably comprise a curing accelerator. The curing accelerator may be selected as appropriate for the semiconductor encapsulation adhesive composition and the semiconductor encapsulation film-like adhesive composition.

Phosphines and imidazoles may be mentioned as curing accelerators. As examples of phosphines there may be mentioned triphenylphosphine, tetraphenylphosphonium tetraphenylborate, tetraphenylphosphonium tetra(4-methylphenyl)borate and tetraphenylphosphonium (4-fluorophenyl) borate. As examples of imidazoles there may be mentioned 2-phenylimidazole, 2-phenyl-4-methylimidazole, 1-benzyl-2-methyl imidazole, 1-benzyl-2-phenylimidazole, 1-cyanoethyl-2-undecylimidazole, 1-cyano-2-phenylimidazole, 1-cyanoethyl-2-undecylimidazole trimellitate, 1-cyanoethyl-2-phenylimidazolium trimellitate, 2,4-diamino-6-[2'-methylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazineisocyanuric acid adduct, 2-phenylimidazoleisocyanuric acid adduct, 2-phenyl-4,5-dihydroxymethylimidazole, 2-phenyl-4-methyl-5-hydroxymethylimidazole, and epoxy resin and imidazole adducts. Preferred for use according to the invention, from the viewpoint of curability and storage stability, are the imidazole and organic acid adducts 1-cyanoethyl-2-undecylimidazole trimellitate, 1-cyanoethyl-2-phenylimidazolium trimellitate, 2,4-diamino-6-[2'-methylimidazolyl-(1')]ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazineisocyanuric acid adduct and 2-phenylimidazoleisocyanuric acid adduct, and the high-melting-point imidazoles 2-phenyl-4,5-dihydroxymethylimidazole and 2-phenyl-4-methyl-5-hydroxymethylimidazole. More preferred are 2,4-diamino-6-[2'-methylimidazolyl-(1')]-ethyl-s-triazineisocyanuric acid adduct and 2-phenyl-4,5-dihydroxymethylimidazole. These may be used alone, or two or more may be used in combination. They may also be used in microcapsulated form for increased latency.

The curing accelerator content is preferably 0.001-0.1 part by weight, more preferably 0.001-0.05 part by weight and even more preferably 0.001-0.03 part by weight with respect to 1 part by weight of the mixture of the (a) epoxy resin and (b) curing agent. If the weight ratio is less than 0.001 part by weight, the curability of the adhesive composition and film-like adhesive may be reduced, and if it is greater than 0.1 part by weight, curing may occur before connection has been formed by the gold-tin eutectic bonding, thus leading to poor connection.

The adhesive composition and film-like adhesive of the invention preferably additionally contain a filler, to modify the viscosity or cured physical properties, and to reduce void formation and the moisture absorption coefficient during connection between the semiconductor chips and board.

The filler may be an electronic insulation inorganic filler, whiskers, or a resin filler. As examples of electronic insulation inorganic fillers there may be mentioned glass, silica, alumina, titanium oxide, carbon black, mica and boron nitride, among which silica, alumina, titanium oxide and boron nitride are preferred, and silica, alumina and boron nitride are more preferred. As examples of whiskers there may be mentioned aluminum borate, aluminum titanate, zinc oxide, calcium silicate, magnesium sulfate and boron nitride whiskers. Polyurethane and polyimide, for example, may be used as resin fillers. These fillers and whiskers may be used alone, or two or more different types may be used in admixture. No particular restrictions are placed on the shapes, particle sizes and content of the filler when used.

The adhesive composition and film-like adhesive of the invention may contain a silane coupling agent, titanium coupling agent, leveling agent and ion trapping agent. These may be used alone or in combinations of two or more. The contents of such additives may be adjusted as suitable to exhibit their effects.

The melt viscosity of the film-like adhesive of the invention at 350° C. is preferably no higher than 2000 Pa·s, more preferably no higher than 200-1800 Pa·s and most preferably no higher than 500-1500 Pa·s. A melt viscosity of higher than 2000 Pa·s will tend to cause the film-like adhesive to remain between bumps and wirings when it is used to connect semiconductor chips to a board, leading to more initial conduction defects.

According to the invention, the melt viscosity of the film-like adhesive at 350° C. is the value calculated by the parallel-plate plastometer method, based on the change in volume (thickness) of the film-like adhesive before and after contact bonding at a temperature of 350° C. Formula (1) below is used to calculate the viscosity from the volume change by the parallel-plate plastometer method.

$$\mu = 8\pi F t Z^4 Z_0^4 / 3 V^2 (Z_0^4 - Z^4) \quad (1)$$

$\mu$: Melt viscosity (Pa·s)
F: Load (N)
t: Pressing time (s)
$Z_0^4$: Initial thickness (m)
$Z^4$: Thickness after pressing (m)
V: Resin volume (m$^3$)

The film-like adhesive of the invention preferably has a void formation rate of no greater than 5%, more preferably no greater than 3% and even more preferably no greater than 1%, upon contact bonding for 5 seconds at 350° C., 1 MPa. A void formation rate of greater than 5% may result in residual voids between narrow-pitch wiring, and lower electronic insulation reliability.

The following is an example of a method of producing a film-like adhesive of the invention. The (a) epoxy resin, (b) curing agent (c) antioxidant, (d) polyimide resin used as a high molecular component, and additives (curing accelerator, filler, etc.) are added to an organic solvent, and the mixture is stirred and kneaded to dissolution or dispersion to prepare a resin varnish. The resin varnish is then coated onto a release-treated base film using a knife coater, roll coater or applicator, and the organic solvent is removed by heating to form a film-like adhesive on the base film. The polyimide resin, i.e. the (d) high molecular component may be used in the form of a solvent-containing polyimide resin varnish without isolation after synthesis, and the components added to the polyimide resin varnish to obtain the final resin varnish.

The organic solvent used to prepare the resin varnish is preferably one capable of uniformly dissolving or dispersing the components, such as dimethylformamide, dimethylacetamide, N-methyl-2-pyrrolidone, dimethyl sulfoxide, diethyleneglycol dimethyl ether, toluene, benzene, xylene, methyl ethyl ketone, tetrahydrofuran, ethylcellosolve, ethylcellosolve acetate, butylcellosolve, dioxane, cyclohexanone, ethyl acetate or the like. These organic solvents may be used alone or in combinations of two or more. The mixing and kneading for preparation of the resin varnish may be accomplished using a stirrer, kneader, triple roll, ball mill, homodisperser mixer or the like.

The base film is not particularly restricted so long as it has heat resistance allowing it to withstand the heating conditions for volatilization of the organic solvent, and examples include polyester films, polypropylene films, polyethylene terephthalate films, polyimide films, polyetherimide films, polyether naphthalate films and methylpentene films. The base film is not limited to being a monolayer film and may instead be a multilayer film composed of two or more different materials.

The conditions for volatilization of the organic solvent from the coated resin varnish are preferably conditions that allow complete volatilization of the organic solvent, and specifically may involve heating at 50-200° C. for 0.1-90 minutes.

(Method for Producing Semiconductor Device)

The method for producing a semiconductor device according to the invention comprises a step of connecting bump-bearing semiconductor chips to a board with metal wiring at a temperature of 200° C. or above using a semiconductor encapsulation adhesive composition or semiconductor encapsulation film-like adhesive according to the invention, and underfilling the gaps between the semiconductor chips and the board using the semiconductor encapsulation adhesive composition or semiconductor encapsulation film-like adhesive.

The material for the bumps formed on the semiconductor chips is not particularly restricted, and may be gold, low melting point solder, high melting point solder, nickel, tin or the like. Gold is preferred for COF.

The board may be of any material, such as an inorganic board made of a ceramic, or an organic board made of an epoxy, bismaleimidetriazine or polyimide. Polyimide is preferred for COF.

The material used to form the wiring on the board may be copper, aluminum, silver, gold, nickel or the like. The wiring is formed by etching or pattern coating. The wiring surface may also be coated with gold, nickel, tin or the like. For COF, copper wiring with a tin coated surface is preferred.

The semiconductor chips and board are connected using an adhesive composition or film-like adhesive of the invention as described above. When a film-like adhesive of the invention is used, the film-like adhesive may be cut to the prescribed size and then attached to the board, or it may be attached to the bump-formed side of a semiconductor wafer and the semiconductor wafer then diced into individual sections to produce film-like adhesive-attached semiconductor chips. The area and thickness of the film-like adhesive may be appropriately set depending on the semiconductor chip size or bump heights.

After attaching the film-like adhesive to the board or semiconductor chips, the wiring pattern and semiconductor chip bumps on the board are positioned and pressed together for 0.5-5 seconds at a connection temperature of 200° C. or higher, and preferably 300-450° C. The load applied for connection will depend on the number of bumps, and it is set so as to absorb the variation in bump height and to control the degree of bump deformation. After the semiconductor chips and board have been connected, semiconductor device or packaging may be subjected to heat treatment in an oven. When an adhesive composition is used, the semiconductor chips and board are connected by the same method described above, using the adhesive composition between the board and semiconductor chips.

A semiconductor device produced by this method has minimal voids between the chips and board and satisfactory electronic insulation reliability.

EXAMPLES

The invention will now be explained in greater detail based on examples and comparative examples, with the understanding that the invention is not limited by the examples.

Synthesis Example

Synthesis of Polyimide Resin

In a 300 ml flask equipped with a thermometer, stirrer and calcium chloride tube there were charged 2.10 g (0.035 mol) of 1,12-diaminododecane, 17.31 g (0.03 mol) of polyetherdiamine (trade name: D2000 by BASF, molecular weight: 1923), 2.61 g (0.035 mol) of 1,3-bis(3-aminopropyl)tetramethyldisiloxane (trade name: LP-7100 by Shin-Etsu Chemical Co., Ltd.) and 150 g of N-methyl-2-pyrrolidone (product of Kanto Kagaku Co., Ltd.), and the mixture was stirred. After dissolution of the diamine, the flask was cooled in an ice bath while adding in small portions at a time 15.62 g (0.10 mol) of 4,4'-(4,4'-isopropylidenediphenoxy)bis(phthalic acid dianhydride) (trade name: BPADA by Aldrich) that had been purified by recrystallization from acetic anhydride. After reaction for 8 hours at room temperature, 100 g of xylene was added, the mixture was heated at 180° C. while blowing in nitrogen gas, and the xylene was azeotropically removed with the water to obtain a polyimide resin solution. The polyimide resin had a Tg of 27° C., a weight-average molecular weight of 47,000 and an SP value of 10.2.

Example 1

In a 20 ml glass screw tube there were charged 1.00 g (solid content) of the polyimide resin synthesized in the Synthesis Example, 0.11 g of an epoxy resin (YDCN-702), 0.11 g of another epoxy resin (VG3101 L), 0.08 g of a curing agent (KAYAHARD NHN), 0.07 g of a silica filler (R972), 0.46 g of boron nitride (HPP1-HJ), 0.002 g of a curing accelerator (2MAOK-PW) and 0.055 g of an antioxidant (AO-60), and then N-methyl-2-pyrrolidone (NMP) was added to a solid content of 40 wt % and the mixture was stirred and degassed with a stirrer/degasser (trade name: AR-250 by Thinky) to obtain a resin varnish. The resin varnish was coated onto a release-treated film (trade name: PUREX A53 by Teijin-DuPont Films) using a coating machine (trade name: PI-1210 FILMCOATER by Tester Sangyo Co., Ltd.), and then dried in a clean oven (product of Espec) at 80° C. for 30 minutes and then at 120° C. for 30 minutes, to obtain a film-like adhesive.

Examples 2-3 and Comparative Examples 1-4

Film-like adhesives for Examples 2-3 and Comparative Examples 1-4 were obtained in the same manner as Example 1, except that the composition for preparation of each resin varnish was as listed in Tables 1 and 2. The material contents in Table 1 are shown as parts by weight.

The materials used in the examples and comparative examples were as follows.
(a) Epoxy Resins
Cresol-novolac-type epoxy resin (trade name: YDCN-702 by Tohto Kasei Co., Ltd.)
Polyfunctional special epoxy resin (trade name: VG3101 L by Printec)
(b) Curing Agent
Cresolnaphthol-formaldehyde polycondensate (trade name: KAYAHARD NHN by Nippon Kayaku Co., Ltd.)
(c) Antioxidants
Hindered phenol 1 (trade name: AO-60 by Adeka)
Hindered phenol 2 (trade name: YOSHINOX BB by API Corporation)
(d) High Molecular Component with Weight-Average Molecular Weight of 10,000 or Greater
Polyimide resin synthesized in Synthesis Example (hereinafter referred to as "synthetic polyimide")
(e) Curing Accelerator
2,4-Diamino-6-[2'-methylimidazolyl-(1')]-ethyl-s-triazineisocyanuric acid adduct (trade name: 2MAOK-PW, product of Shikoku Chemicals Corp.)

(f) Fillers
Boron nitride (trade name: HPP1-HJ by Mizushima Ferroalloy Co., Ltd., mean particle size: 1.0 μm, maximum particle size: 5.1 μm)
Silica filler (trade name: R972 by Nippon Aerosil Co., Ltd., mean particle size: 20 nm)
(g) Inorganic Ion Scavengers
Cation scavenger (trade name: DCE100 by ToaGosei Co., Ltd.)
Anion scavenger (trade name: IXE500 by ToaGosei Co., Ltd.)
(h) Solvent
N-methyl-2-pyrrolidone (NMP) (product of Kanto Kagaku Co., Ltd.)

TABLE 1

|  | Compound | Example 1 | Example 2 | Example 3 | Comp. Ex. 1 | Comp. Ex. 2 | Comp. Ex. 3 | Comp. Ex. 4 |
|---|---|---|---|---|---|---|---|---|
| Polyimide resin | Synthetic polyimide | 100 | 100 | 100 | 100 | 100 | 100 | 100 |
| Epoxy resin | YDCN-702 | 11 | 11 | 11 | 11 | 11 | 11 | 11 |
|  | VG3101L | 11 | 11 | 11 | 11 | 11 | 11 | 11 |
| Curing agent | KAYAHARD NHN | 8 | 8 | 8 | 8 | 8 | 8 | 8 |
| Antioxidant | AO-60 | 5.5 | — | 5.5 | — | — | — | — |
|  | YOSHINOX BB | — | 5.5 | — | — | — | — | — |
| Curing preventer | 2MAOK-PW | 0.2 | 0.2 | 0.2 | 0.2 | 0.4 | 0.2 | 0.2 |
| Filler | HPP1-HJ | 46 | 46 | 60 | 46 | 46 | 46 | 46 |
|  | R972 | 7 | 7 | 7 | 7 | 7 | 7 | 7 |
| Inorganic ion scavenger | IXE100 | — | — | — | — | — | 5.5 | — |
|  | IXE500 | — | — | — | — | — | — | 5.5 |

<Melt Viscosity Measuring Method>

The film-like adhesive of the example or comparative example was cut (ϕ6 mm, thickness: approximately 0.1 mm), the cut film-like adhesive 4 was attached onto a glass chip 3 (15 mm×15 mm×0.7 mm$^r$) as shown in FIG. 1, and cover glass 7 (18 mm×18 mm×0.12-0.17 mm$^r$) was placed over it to fabricate sample A. Sample A was contact bonded with a flip-chip bonder (FCB3, product of Panasonic) (contact bonding conditions: head temperature: 350° C., stage temperature: 100° C., 5 seconds, 1 MPa), and the change in volume of the film-like adhesive before and after contact bonding was measured. The melt viscosity was calculated from the volume change based on the parallel-plate plastometer method, using formula (1) below. The results are shown in Table 2.

(Calculation of Viscosity by Parallel-Plate Plastometer Method)

$$\mu = 8\pi F t Z^4 Z_0^4 / 3 V^2 (Z_0^4 - Z^4) \qquad (1)$$

μ: Melt viscosity (Pa·s)
F: Load (N)
t: Pressing time (s)
$Z_0^4$: Initial thickness (m)
$Z^4$: Thickness after pressing (m)
V: Resin volume (m$^3$)

<Void Formation Rate Measuring Method>

Figure 2:
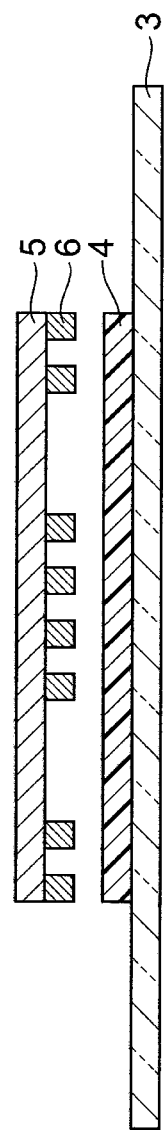
FIG. 2 is a schematic cross-sectional view showing the condition of void formation rate measuring sample B before contact bonding.

The film-like adhesive of the example or comparative example was cut ((5 mm×5 mm×0.03 mm$^r$), the cut film-like adhesive 4 was attached onto a glass chip 3 (15 mm×15 mm×0.7 mm$^r$) as shown in FIG. 2, and a gold bump 6-attached chip 5 (4.26 mm×4.26 mm×0.27 mm$^r$, bump height: 0.02 mm) was placed over it to fabricate sample B. Sample B was contact bonded with an FCB3 (product of Panasonic) (contact bonding conditions: head temperature: 350° C., stage temperature: 100° C., 5 seconds, 1 MPa), and the void formation rate was measured before and after contact bonding. The void formation rate was calculated as the percentage of generated void area after contact bonding with respect to the area of the gold bump-attached chip. On this basis, for contact bonding at 350° C., 1 MPa for 5 seconds, a void formation rate of up to 5% was evaluated as "A" and a value of greater than 5% was evaluated as "B". The results are shown in Table 2.

<Method for Producing Semiconductor Device (Evaluating Conduction and Outer Appearance)>

Figure 3:
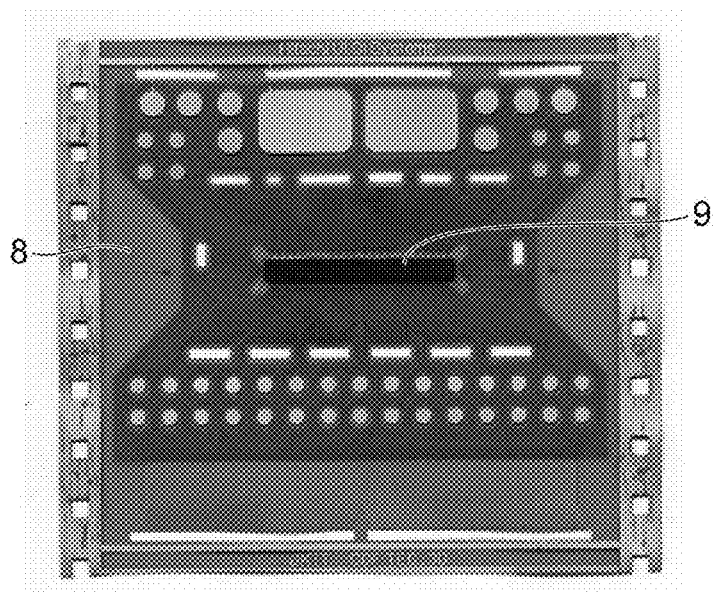
FIG. 3 is a photograph showing an entire semiconductor device fabricated using the film-like adhesive of Example 3.
Figure 4:
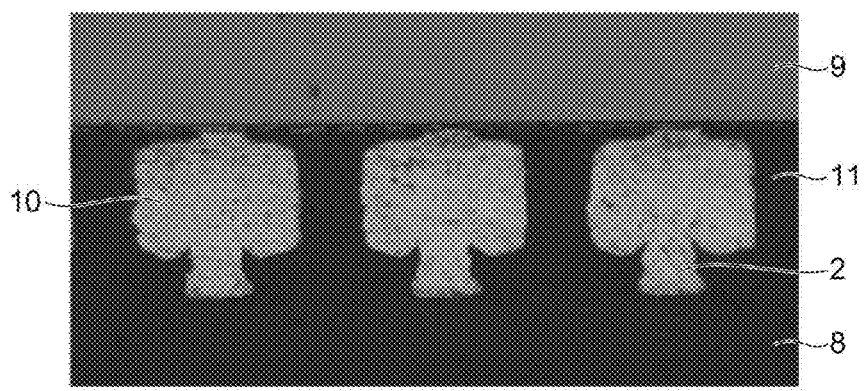
FIG. 4 is a photograph showing a cross-section of the chip-mounted section of a semiconductor device fabricated using the film-like adhesive of Example 3.

The film-like adhesive of the example or comparative example was cut (2.5 mm×15.5 mm×0.03 mm$^r$) and attached to a polyimide board (polyimide base: 38 μm thickness, copper wiring: 8 μm thickness, wiring tin coating: 0.2 μm thickness, trade name: JKIT COF TEG_30-B by Hitachi ULSI Systems Co., Ltd.), and then a gold bump-bearing chip (chip size: 1.6 mm×15.1 mm×0.4 mm$^r$, bump size: 20 μm×100 μm×15 μm$^r$, bump count: 726, trade name: JTEG PHASE6_30 by Hitachi ULSI Systems Co., Ltd.) was mounted on it with an FCB3 (Panasonic) (mounting conditions: head temperature: 350° C., stage temperature: 100° C., 5 seconds, 50N). FIG. 3 is a photograph showing the entire semiconductor device obtained in Example 3, with the semiconductor chip 9 mounted on the polyimide board 8. FIG. 4 is a photograph showing a cross-section of the chip-mounted section of the semiconductor device obtained in Example 3, wherein tin-coated copper wiring 2 of the polyimide board 8 is connected with gold bumps 10 on the semiconductor chip 9 by gold-tin eutectic connection, and the gap between the semiconductor chip 9 and polyimide board 8 is underfilled by the cured film-like adhesive 11.

When a semiconductor device was fabricated by mounting the gold bump-bearing chip (daisy chain connection) on the polyimide board with an FCB3 using the film-like adhesive, the connection resistance between the gold bump-bearing chip and copper wiring was approximately 155Ω. The connection resistance between the gold bump-bearing chip and copper wiring was measured for each of the semiconductor devices fabricated using the film-like adhesives of the examples and comparative examples, and a value of less than 170Ω was evaluated as having initial conduction ("A") while a value of 170Ω or greater was evaluated as having no initial conduction ("B"). The results are shown in Table 2.

<Electronic Insulation Reliability Test (HAST: Highly Accelerated Storage Test)>

Figure 5:
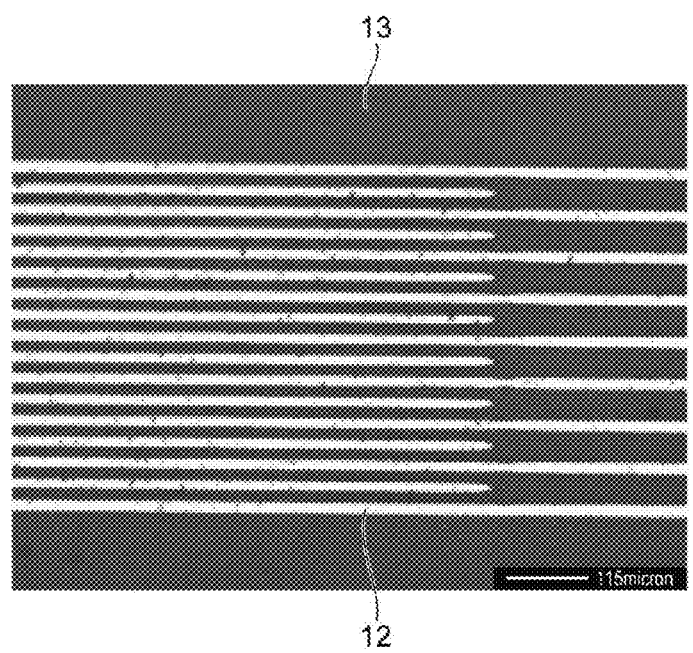
FIG. 5 is a photograph showing an overview of sample C (test vehicle with interdigitated array pattern) set in an accelerated life tester in an electronic insulation reliability test.

The film-like adhesives of the examples and comparative examples (thickness: 30 μm) were each attached to a comb-shaped electrode evaluating TEG (Perflex-S by Shindo, wiring pitch: 30 μm) and cured at 180° C. for 1 hour in a clean oven (Espec Corp.). After curing, sample C (FIG. 5) was removed and set in an accelerated life tester (trade name: PL-422R8 by Hirayama, conditions: 110° C./85% RH/100 hours) to measure the insulation resistance. Sample C was the cured film-like adhesive 12 attached to a tin-coated copper wiring (comb-shaped electrode evaluating TEG) 13, as shown in FIG. 5. For evaluation after 100 hours, an insulation resistance of $1\times10^8 \Omega$ or greater was evaluated as "A", a minimum insulation resistance of at least $1\times10^7 \Omega$ and less than $1\times10^8 \Omega$ was evaluated as "B", and a minimum insulation resistance of less than $1\times10^7 \Omega$ was evaluated as "C". An evaluation result of "C" represents poor practical utility. The results are shown in Table 2.

A sample was also cured at 180° C. for 1 hour, with the same apparatus, procedure and conditions as in <Method for producing semiconductor device (Evaluating conduction and outer appearance)> above. After curing, the sample was removed and set in an accelerated life tester (trade name: PL-422R8 by Hirayama, conditions: 110° C./85% RH/100 hours) to measure the insulation resistance. With evaluation after 100 hours, an insulation resistance of $1\times10^8 \Omega$ or greater was evaluated as "A", a minimum insulation resistance of at least $1\times10^7 \Omega$ and less than $1\times10^8 \Omega$ was evaluated as "B", and a minimum insulation resistance of less than $1\times10^7 \Omega$ was evaluated as "C". An evaluation result of "C" represents poor practical utility. The results are shown in Table 2.

In the antioxidant-added Examples 1-3, the insulation resistance value stabilized at a higher value than Comparative Examples 1-4.

The results shown in Table 3 confirmed that the concentrations of acetate and formate ion, which are considered causes of thermal oxidative deterioration, were lower in Example 1 than in Comparative Example 1.

What is claimed is:

1. A semiconductor device comprising:
   (1) at least one semiconductor chip;
   (2) a board, wherein the at least one semiconductor chip is connected to the board; and
   (3) a semiconductor encapsulation adhesive composition that-comprising
      (a) an epoxy resin,
      (b) a curing agent,
      (c) an antioxidant, wherein the antioxidant is a hindered phenol, and
      (d) a high molecular component with a weight-average molecular weight of 10,000 or greater
   wherein gaps between the semiconductor chips and the board are underfilled with the semiconductor encapsulation adhesive composition.

2. The semiconductor device according to claim 1, wherein the high molecular component with a weight-average molecular weight of 10,000 or greater comprises at least one component selected from a group consisting of phenoxy resin, polyimide resin, polyamide resin, polycarbodiimide

TABLE 2

|  | Curing conditions | Example 1 | Example 2 | Example 3 | Comp. Ex. 1 | Comp. Ex. 2 | Comp. Ex. 3 | Comp. Ex. 4 |
|---|---|---|---|---|---|---|---|---|
| Melt viscosity (Pa·s) | 350° C./5 s | 700 | 700 | 1250 | 700 | 3000 | 700 | 700 |
| Void formation rate | 350° C./5 s | A | A | A | A | A | A | A |
| Initial conduction | 350° C./5 s | A | A | A | A | B | A | A |
| Insulation resistance test | 180° C./1 h | A | B | A | C | C | C | C |
| Insulation resistance test | 350° C./5 s + 180° C./1 h | A | B | A | C | C | C | C |

<Impurity Ion Concentration Measurement>

For comparison of the impurity ion concentrations (acetate ion and formate ion) of Example 1 (with antioxidant) and Comparative Example 1 (without antioxidant), the cured film-like adhesive (thickness: 30 μm) that had been cured at 180° C. for 1 hour in a clean oven (Espec) was cut out to a size of 5 mm×5 mm (approximately 1 g), placed in a stainless steel jacketed Teflon crucible and diluted 10-fold with purified water. The diluted solution was then placed in a miniature constant temperature tester (ETAC) and ion extraction was performed (121° C./20 hours). After extraction, it was filtered and the impurity ion concentration was measured with an ion chromatograph (Dionex Corporation). The results are shown in Table 3.

TABLE 3

|  |  | Example 1 | Comp. Ex. 1 |
|---|---|---|---|
| Impurity ion concentration (ppm) | $CH_3COO^-$ | 134.96 | 190.66 |
|  | $HCOO^-$ | 245.64 | 271.38 |

Examples 1-3 had 350° C. melt viscosities of below 2000 Pa·s and were therefore evaluated as having "initial conduction", while Comparative Example 2 had a 350° C. viscosity of greater than 2000 Pa·s and was therefore evaluated as having "no initial conduction".

resin, phenol resin, cyanate ester resin, acrylic resin, polyester resin, polyethylene resin, polyethersulfone resin, polyetherimide resin, polyvinylacetal resin, urethane resin, acrylic rubber or copolymers of two or more different types thereof.

3. The semiconductor device according to claim 1, wherein the high molecular component comprises polyimide resin.

4. The semiconductor device according to claim 3, wherein the polyimide resin has a weight-average molecular weight of 30,000 or greater and a glass transition temperature of no higher than 100° C.

5. The semiconductor device according to claim 4, wherein the curing agent is a phenol compound.

6. A method for producing a semiconductor device, the method comprising the steps of:
   (1) connecting semiconductor chips to a board using a semiconductor encapsulation adhesive composition; and
   (2) underfilling the gaps between the semiconductor chips and the board using the semiconductor encapsulation adhesive composition,
   wherein the semiconductor encapsulation adhesive composition comprises (a) an epoxy resin, (b) a curing agent, (c) an antioxidant, wherein the antioxidant is a hindered phenol, and (d) a high molecular component with a weight-average molecular weight of 10,000 or greater.

7. The method according to claim 6, wherein the high molecular component with a weight-average molecular weight of 10,000 or greater comprises at least one component selected from a group consisting of phenoxy resin, polyimide resin, polyamide resin, polycarbodiimide resin, phenol resin, cyanate ester resin, acrylic resin, polyester resin, polyethylene resin, polyethersulfone resin, polyetherimide resin, polyvinylacetal resin, urethane resin, acrylic rubber or copolymers of two or more different types thereof.

8. The method according to claim 6, wherein the high molecular component comprises polyimide resin.

9. The method according to claim 8, wherein the polyimide resin has a weight-average molecular weight of 30,000 or greater and a glass transition temperature of no higher than 100° C.

10. The method according to 6, wherein the curing agent is a phenol compound.

11. A semiconductor device, where the semiconductor device is produced by the method according to claim 6.

* * * * *